United States Patent [19]

Young

[11] Patent Number: 5,828,230
[45] Date of Patent: Oct. 27, 1998

[54] FPGA TWO TURN ROUTING STRUCTURE WITH LANE CHANGING AND MINIMUM DIFFUSION AREA

[75] Inventor: Steven P. Young, San Jose, Calif.

[73] Assignee: Xilinx, Inc., San Jose, Calif.

[21] Appl. No.: 775,425

[22] Filed: Jan. 9, 1997

[51] Int. Cl.[6] .............................................. H03K 19/177
[52] U.S. Cl. .............................................. 326/41; 326/39
[58] Field of Search ........................................ 326/38–41

[56] References Cited

U.S. PATENT DOCUMENTS

| Re. 34,363 | 8/1993 | Freeman | 307/465 |
| 5,504,439 | 4/1996 | Tavana | 326/38 |
| 5,682,107 | 10/1997 | Tavan et al. | 326/41 |

*Primary Examiner*—Michael J. Tokar
*Assistant Examiner*—Don Phu Le
*Attorney, Agent, or Firm*—Lois D. Cartier

[57] ABSTRACT

A two-turn programmable routing structure is provided for a programmable logic device that provides a high degree of routing flexibility, with lane-changing capability, while requiring a relatively small diffusion surface area. One routing structure according to the invention provides lane-changing capability for every interconnect line in the structure and a fast path for each interconnect line running straight through the structure. The routing structure preferably comprises a unitary elongated diffusion area separated by voltage-controlled transistor gates into serially arrayed adjacent diffusion regions. The sequential diffusion regions are connected to interconnect lines having assigned directions, and can be grouped into sets of N directions, where N is a multiple of eight. The directions associated with the set of diffusion regions follow specified rules that impart the diffusion-sharing, lane-changing, and fast-path capabilities of the routing structure of the invention.

19 Claims, 13 Drawing Sheets

DIRECTIONS IN FIRST EMBODIMENT
(32 INTERCONNECT LINES)

| | | | |
|---|---|---|---|
| W0 | | | |
| N7 | TRIPLE | | |
| S7 | | | |
| N7 | | | |
| E7 | | SET | |
| W7 | TRIPLE | i = 7 | |
| E7 | | | |
| S7 | SINGLE | | |
| W7 | SINGLE | | PAT-TERN |
| N6 | TRIPLE | | |
| S6 | | | |
| N6 | | | |
| E6 | SINGLE | SET | |
| S6 | SINGLE | i = 6 | |
| W6 | | | |
| E6 | TRIPLE | | |
| W6 | | | |
| N5 | TRIPLE | | |
| S5 | | | |
| N5 | | | |
| E5 | | SET | |
| W5 | TRIPLE | i = 5 | |
| E5 | | | |
| S5 | SINGLE | | |
| W5 | SINGLE | | PAT-TERN |
| N4 | TRIPLE | | |
| S4 | | | |
| N4 | | | |
| E4 | SINGLE | SET | |
| S4 | SINGLE | i = 4 | |
| W4 | | | |
| E4 | TRIPLE | | |
| W4 | | | |

(CONTINUED FROM PREVIOUS COLUMN)

| | | | |
|---|---|---|---|
| N3 | TRIPLE | | |
| S3 | | | |
| N3 | | | |
| E3 | | SET | |
| W3 | TRIPLE | i = 3 | |
| E3 | | | |
| S3 | SINGLE | | |
| W3 | SINGLE | | PAT-TERN |
| N2 | TRIPLE | | |
| S2 | | | |
| N2 | | | |
| E2 | SINGLE | SET | |
| S2 | SINGLE | i = 2 | |
| W2 | | | |
| E2 | TRIPLE | | |
| W2 | | | |
| N1 | TRIPLE | | |
| S1 | | | |
| N1 | | | |
| E1 | | SET | |
| W1 | TRIPLE | i = 1 | |
| E1 | | | |
| S1 | SINGLE | | |
| W1 | SINGLE | | PAT-TERN |
| N0 | TRIPLE | | |
| S0 | | | |
| N0 | | | |
| E0 | SINGLE | SET | |
| S0 | SINGLE | i = 0 | |
| W0 | | | |
| E0 | TRIPLE | | |
| W0 | | | |

FIG. 4C

DIRECTIONS IN SECOND EMBODIMENT
(32 INTERCONNECT LINES)

| W0 | | | |
|---|---|---|---|
| N7 | | | |
| S7 | TRIPLE | | |
| N7 | | | |
| E7 | | SET | |
| W7 | TRIPLE | i = 7 | |
| E7 | | | |
| S5 | i - 2 | | |
| W3 | i + 4 | | |
| N6 | | | |
| S6 | TRIPLE | | |
| N6 | | | |
| E2 | i - 4 | SET | |
| S4 | i - 2 | i = 6 | |
| W6 | | | |
| E6 | TRIPLE | | |
| W6 | | | PAT-TERN |
| N5 | | | |
| S5 | TRIPLE | | |
| N5 | | | |
| E5 | | SET | |
| W5 | TRIPLE | i = 5 | |
| E5 | | | |
| S7 | i + 2 | | |
| W1 | i + 4 | | |
| N4 | | | |
| S4 | TRIPLE | | |
| N4 | | | |
| E0 | i - 4 | SET | |
| S6 | i + 2 | i = 4 | |
| W4 | | | |
| E4 | TRIPLE | | |
| W4 | | | |

(CONTINUED FROM PREVIOUS COLUMN)

| N3 | | | |
|---|---|---|---|
| S3 | TRIPLE | | |
| N3 | | | |
| E3 | | SET | |
| W3 | TRIPLE | i = 3 | |
| E3 | | | |
| S1 | i - 2 | | |
| W7 | i + 4 | | |
| N2 | | | |
| S2 | TRIPLE | | |
| N2 | | | |
| E6 | i - 4 | SET | |
| S0 | i - 2 | i = 2 | |
| W2 | | | |
| E2 | TRIPLE | | |
| W2 | | | PAT-TERN |
| N1 | | | |
| S1 | TRIPLE | | |
| N1 | | | |
| E1 | | SET | |
| W1 | TRIPLE | i = 1 | |
| E1 | | | |
| S3 | i + 2 | | |
| W5 | i + 4 | | |
| N0 | | | |
| S0 | TRIPLE | | |
| N0 | | | |
| E4 | i - 4 | SET | |
| S2 | i + 2 | i = 0 | |
| W0 | | | |
| E0 | TRIPLE | | |
| W0 | | | |

DIRECTIONS IN SECOND EMBODIMENT (96 INTERCONNECT LINES)

| W0 | | SET i=23 | | | | SET i=19 | | | | SET i=15 | | | | SET i=11 | | | | SET i=7 | | | | SET i=3 |
|---|---|---|---|---|---|---|---|---|---|---|---|---|---|---|---|---|---|---|---|---|---|
| N23 | TRI-PLE | | N19 | S19 | N19 | | N15 | S15 | N15 | | N11 | S11 | N11 | | N7 | S7 | N7 | | N3 | S3 | N3 |
| S23 | | | E19 | W19 | E19 | | E15 | W15 | E15 | | E11 | W11 | E11 | | E7 | W7 | E7 | | E3 | W3 | E3 |
| E23 | TRI-PLE | | S17 | W23 | | | S13 | W19 | | | S9 | W15 | | | S5 | W11 | | | S1 | W7 | |
| S21 | i−2 | | N18 | S18 | N18 | | N14 | S14 | N14 | | N10 | S10 | N10 | | N6 | S6 | N6 | | N2 | S2 | N2 |
| W3 | i+4 | | E14 | S16 | W18 | SET i=18 | E10 | S12 | W14 | SET i=14 | E6 | S8 | W10 | SET i=10 | E2 | S4 | W6 | SET i=6 | E22 | S0 | W2 |
| N22 | TRI-PLE | | E18 | W18 | | | E14 | W14 | | | E10 | W10 | | | E6 | W6 | | | E2 | W2 | |
| S22 | | | N17 | S17 | N17 | | N13 | S13 | N13 | | N9 | S9 | N9 | | N5 | S5 | N5 | | N1 | S1 | N1 |
| W22 | | | E17 | W17 | E17 | SET i=17 | E13 | W13 | E13 | SET i=13 | E9 | W9 | E9 | SET i=9 | E5 | W5 | E5 | SET i=5 | E1 | W1 | E1 |
| E18 | i−4 | | S19 | W21 | | | S15 | W17 | | | S11 | W13 | | | S7 | W9 | | | S3 | W5 | |
| S20 | i−2 | | N16 | S16 | N16 | | N12 | S12 | N12 | | N8 | S8 | N8 | | N4 | S4 | N4 | | N0 | S0 | N0 |
| E22 | TRI-PLE | | E12 | S18 | W16 | SET i=16 | E8 | S14 | W12 | SET i=12 | E4 | S10 | W8 | SET i=8 | E0 | S6 | W4 | SET i=4 | E20 | S2 | W0 |
| W22 | | | E16 | W16 | | | E12 | W12 | | | E8 | W8 | | | E4 | W4 | | | E0 | W0 | |

PATTERN (CONTINUED IN NEXT COLUMN)

DIRECTIONS IN THIRD EMBODIMENT
(32 INTERCONNECT LINES)

| W0 | | | |
|---|---|---|---|
| N6 | i - 1 | | |
| S7 | TRIPLE | | |
| N7 | | | |
| E7 | SINGLE | SET | |
| S7 | SINGLE | i = 7 | |
| W6 | i - 1 | | |
| E7 | TRIPLE | | |
| W7 | | | PAT-TERN |
| N7 | i + 1 | | |
| S6 | TRIPLE | | |
| N6 | | | |
| E6 | SINGLE | SET | |
| S6 | SINGLE | i = 6 | |
| W7 | i + 1 | | |
| E6 | TRIPLE | | |
| W6 | | | |
| N4 | i - 1 | | |
| S5 | TRIPLE | | |
| N5 | | | |
| E5 | SINGLE | SET | |
| S5 | SINGLE | i = 5 | |
| W4 | i - 1 | | |
| E5 | TRIPLE | | |
| W5 | | | PAT-TERN |
| N5 | i + 1 | | |
| S4 | TRIPLE | | |
| N4 | | | |
| E4 | SINGLE | SET | |
| S4 | SINGLE | i = 4 | |
| W5 | i + 1 | | |
| E4 | TRIPLE | | |
| W4 | | | |

(CONTINUED IN NEXT COLUMN)

(CONTINUED FROM PREVIOUS COLUMN)

| N2 | i - 1 | | |
|---|---|---|---|
| S3 | TRIPLE | | |
| N3 | | | |
| E3 | SINGLE | SET | |
| S3 | SINGLE | i = 3 | |
| W2 | i - 1 | | |
| E3 | TRIPLE | | |
| W3 | | | PAT-TERN |
| N3 | i + 1 | | |
| S2 | TRIPLE | | |
| N2 | | | |
| E2 | SINGLE | SET | |
| S2 | SINGLE | i = 2 | |
| W3 | i + 1 | | |
| E2 | TRIPLE | | |
| W2 | | | |
| N0 | i - 1 | | |
| S1 | TRIPLE | | |
| N1 | | | |
| E1 | SINGLE | SET | |
| S1 | SINGLE | i = 1 | |
| W0 | i - 1 | | |
| E1 | TRIPLE | | |
| W1 | | | PAT-TERN |
| N1 | i + 1 | | |
| S0 | TRIPLE | | |
| N0 | | | |
| E0 | SINGLE | SET | |
| S0 | SINGLE | i = 0 | |
| W1 | i + 1 | | |
| E0 | TRIPLE | | |
| W0 | | | |

FIG. 7B

FPGA TWO TURN ROUTING STRUCTURE WITH LANE CHANGING AND MINIMUM DIFFUSION AREA

CROSS-REFERENCE TO RELATED APPLICATIONS

This application relates to the following commonly assigned co-pending U.S. patent application Ser. No. 08/761,113 invented by Steven P. Young entitled "FPGA ONE TURN ROUTING STRUCTURE AND METHOD USING MINIMUM DIFFUSION AREA" and filed Dec. 5, 1996, which is incorporated herein by reference.

FIELD OF THE INVENTION

The present invention relates to integrated circuits, and more specifically to a programmable routing structure for routing paths in a programmable logic integrated circuit device which provides high routing flexibility for paths through the structure, lane-changing capability, and an optional fast path straight through the structure, while using minimum diffusion surface area.

BACKGROUND OF THE INVENTION

Field programmable gate arrays (FPGAs) typically have at least two distinct programmable features. One such feature is the logic block, which typically may be programmed to assume a variety of logic functions such as some or all Boolean logic functions for a given number of inputs. The other such feature is the interconnection of such logic blocks via paths that interconnect the outputs and inputs of several logic blocks in a selected sequence to achieve a desired result. Numerous programmable routing structures have been designed to achieve various levels of choice in routing signal paths through a programmable device. U.S. Pat. No. Re. 34,363, which is incorporated herein by reference and title to which is held by the assignee hereof, discloses a programmable routing structure in the first FPGA. U.S. application Ser. No. 08/761,113 entitled "FPGA One Turn Routing Structure and Method Using Minimum Diffusion Area", which is referenced above and incorporated herein by reference, discloses a one-turn programmable routing structure with minimum diffusion area.

Prior art programmable routing structures typically consist of interconnect lines programmably connectable by a dispersed number of switching devices such as field effect transistors, the selected conditions of which (i.e., open or closed) determine the chosen path for a signal communicated between programmed logic blocks through such routing structures. A larger number of available paths through such a routing structure provides more flexible routing, but there is a penalty for the added flexibility. The dispersal of switching devices often requires numerous diffusion areas within the integrated circuit device, which use a large amount of silicon surface area. To minimize cost, surface area must be used efficiently, particularly where a relatively large number of signal paths must be provided within a relatively small surface area. The larger the number of available paths through a routing structure, i.e. the more flexible the routing structure and the more routable the paths through the structure, the less efficient the usage of surface area becomes. Therefore, there is a need to provide a flexible routing structure which nevertheless minimizes diffusion surface area.

Further, for signals on paths that turn within the programmable routing structure, many prior art structures connect a given interconnect line to a corresponding perpendicular interconnect line. For example, if a group of parallel interconnect lines is considered to consist of a group of adjacent "lanes", and there are corresponding lanes in the other three compass directions, an interconnect line in one group entering the structure in the first such lane will leave the structure in the same lane of a perpendicular group. Since connections to logic block inputs and outputs are often different for different lanes, it is desirable for a routing structure to permit lane-changing.

Yet further, for typical prior art programmable routing structures, each path through the structure has the same or approximately the same delay. However, paths traveling long distances within the FPGA have increased capacitive loading and increased resistance due to having several field effect transistors in series, and therefore are generally slower than paths traveling shorter distances. Such a long path can easily be implemented as a single long straight path, or as a path with only one turn. If such paths could be made faster relative to paths with more turns, a smaller delay would result for longer paths, which in turn would lead in some cases to a faster overall speed for the programmed circuit. Therefore, there is a need to provide a routing structure with a fast path for signals passing straight through the structure.

SUMMARY OF THE INVENTION

A programmable routing structure is provided for a programmable logic integrated circuit device, providing a high degree of routing flexibility for paths through the structure while using minimum diffusion surface area, further providing lane-changing capability and in some embodiments a fast path straight through the structure. The routing structure includes an elongated "diffusion area" (all or part of a piece of diffusion implemented in a semiconductor device) separated by voltage-controlled transistor gates into serially arrayed adjacent "diffusion regions".

Inputs and outputs to the programmable routing structure are herein designated as "interconnect lines". Each interconnect line (e.g., W0) has an associated "direction" (e.g. W or West) taken from a group of four compass directions and defined by the predominant direction the interconnect line extends from the routing structure. Each diffusion region also has an associated direction, by which it is meant that such diffusion region is electrically connected to an interconnect line having that associated direction. Each interconnect line is electrically connected to at least two diffusion regions. A routing structure according to the invention includes a sequence of N adjacent diffusion regions, where N is a multiple of 8. A "set" is considered to be a sequence of N adjacent diffusion regions. All diffusion regions are grouped into either "triples" or "singles". A "triple" is a sequence of three adjacent diffusion regions wherein the directions associated with the two outer diffusion regions are the same, and the direction associated with the central diffusion region is parallel but opposite thereto. A "single" is a diffusion region in the set that cannot be grouped into a triple. Since each triple includes three diffusion regions having three associated parallel directions, two triples may be said to be either parallel or perpendicular to other triples or to singles.

A routing structure according to the invention comprises at least one set conforming to the following criteria: the set includes an even number of triples and an equal even number of singles; half the triples in the set are perpendicular to the other half; half the singles in the set are perpendicular to the other half; the set includes an equal number of diffusion regions having associated directions that correspond to each of the four compass directions; each of said triples is adjacent only to diffusion regions having associated directions perpendicular to the direction of said triple, and, where there are two such adjacent diffusion regions, said two diffusion regions have associated directions opposite to each other; and each single is electrically connected to the center of a triple, which may be in the same or a different set.

An "extra" diffusion region, not part of any set, can be added, preferably at one end of the diffusion area. The direction associated with the extra diffusion region may be the same as the direction associated with the diffusion region at the other end of the diffusion area. In the preferred embodiments the extra diffusion region is electrically connected to the diffusion region at the other end of the diffusion area, such that the pattern of directions can continue in a repeating fashion.

Only one set may be used, or the same set may be repeated along the entire length of the diffusion area. Alternatively, sets formed according to the inventive criteria but having different sequences of associated directions may be placed next to each other. Such groups of sets may be repeated, forming larger patterns. In any case, adjacent diffusion regions that are members of two different sets must still conform to the inventive criteria detailed above. Further, patterns may be formed between sets with the same or different sequences of associated directions by electrically connecting diffusion regions in different sets. These patterns may also be repeated.

In first and second embodiments, the two outside diffusion regions in each triple are electrically connected together. In the first embodiment of the invention, each of the singles in each set is electrically connected to the center of a triple in the same set. In the second embodiment of the invention, each of the singles in a given set is electrically connected to the center of a triple in a different set. In a third embodiment, one of the two outside diffusion regions in each triple is electrically connected to an outside diffusion region of a triple in another set.

The present invention assures two turn connectivity for all of the interconnect lines in the routing structure (i.e., every interconnect line has programmable paths going straight, turning right, and turning left). For the first and second embodiments, a fast path is provided for signals traveling straight through the structure by providing two transistors in parallel for straight paths instead of the single transistor used for turning paths. For the third embodiment, the fast path is not available, but each straight path has instead two different straight output lanes that are available to each input interconnect line.

In addition, the present invention results in a reduction in the number of separate diffusion areas while accommodating all interconnect lines and all diffusion regions in one elongated, area-limited diffusion area wherein total diffusion surface area, for a given number of connections, is reduced. Further, in every embodiment, some interconnect lines have lane-changing capability. In some embodiments, every interconnect line has lane-changing capability.

BRIEF DESCRIPTION OF THE DRAWINGS

The objects and advantages of the present invention will be more fully understood hereinafter as a result of a detailed description of the preferred embodiments when taken in conjunction with the following drawings.

FIG. 4B corresponds directly to FIG. 4A. Note that FIG. 4B is drawn rotated 90 degrees from FIG. 4A.

FIG. 4C is a table showing the pattern of directions associated with sequential diffusion regions in the first embodiment of the invention. FIG. 4C corresponds directly to FIGS. 4A and 4B.

FIG. 5B corresponds directly to FIG. 5A. Note that FIG. 5B is drawn rotated 90 degrees from FIG. 5A.

FIG. 5C is a table showing the pattern of directions associated with sequential diffusion regions in the second embodiment of the invention. FIG. 5C corresponds directly to FIGS. 5A and 5B.

FIG. 6B is a table showing the pattern of directions in the second embodiment of the invention with a larger number of interconnect lines and signal paths, and clarifying the pattern of directions assigned to sequential diffusion regions therein. FIG. 6B corresponds directly to FIG. 6A.

FIG. 7B is a table showing the pattern of directions associated with sequential diffusion regions in the third embodiment of the invention. FIG. 7B corresponds directly to FIG. 7A.

DETAILED DESCRIPTION OF EMBODIMENTS OF THE INVENTION

Figure 1:
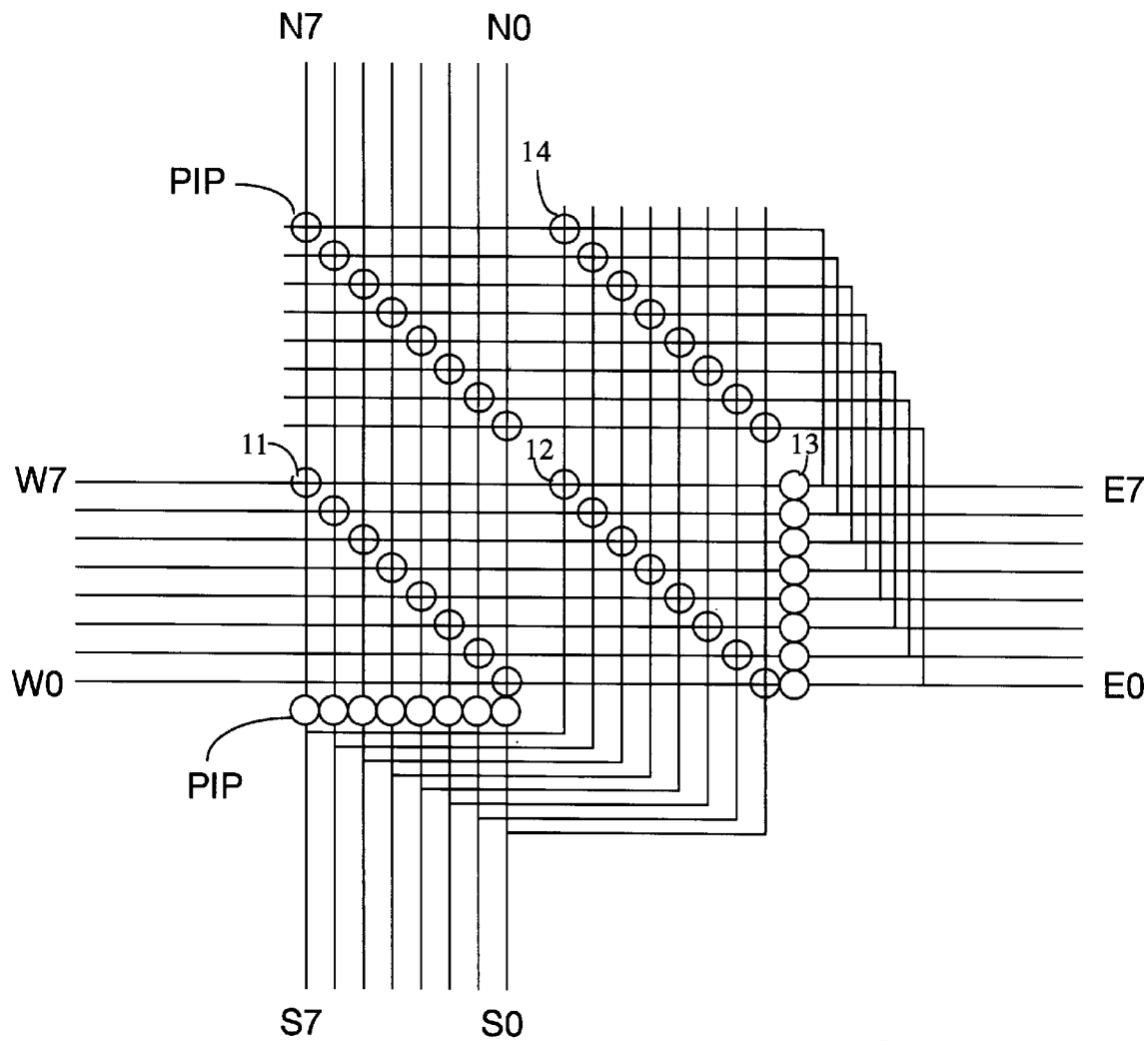
FIG. 1 is an architectural representation of a programmable routing structure of the prior art.

Referring first to prior art FIG. 1, it will be seen that in a typical routing structure within a programmable logic device, interconnect lines are identified by compass directions corresponding to their entrance or exit directions. These compass directions define the predominant directions of the wires forming the interconnect lines, but the actual layout of any given wire may not be in a precise compass direction, and may include jogs or zig-zags. Additionally, the interconnect lines can be viewed as being either horizontal or vertical, with endpoints at the routing structure, in which case there are only two types of interconnect lines instead of four. However, the identification method using four compass directions was found to be most convenient for the present description. Notwithstanding this nomenclature, in the preferred embodiments each interconnect line is bidirectional.

Each interconnect line passes through one or more programmable interconnection points (PIPs), where a signal is selectively transmitted from one interconnect line to another by virtue of a programmed path dependent upon the status of one or more switches, as determined by the presence or absence of a voltage at a transistor gate interconnecting two diffusion regions.

As previously indicated, one does not always have the surface area "luxury" of providing large numbers of dispersed diffusion areas and an expansive distribution of paths. It is desirable to provide a large number of programmable connections between interconnect lines with different directions, to provide routing flexibility, while minimizing the amount of diffusion surface area required to implement the resulting routing structure. It is also desirable to have lane-changing capability (for example, to enter the routing structure in one direction on a lane at one edge of a group of parallel lanes, and leave the structure on one of the central lanes in a different direction), since different lanes often have different connections to logic block inputs and outputs.

Prior art FIG. 1 shows a programmable routing structure that permits any interconnect line to go straight, turn left, or turn right while traversing a single PIP. For example, interconnect line W7 can go straight onto line E7 through PIP 13, turn left onto line N7 through PIP 11, or turn right onto line S7 through PIP 12. This structure is therefore a two-turn routing structure. However, it is clear that this structure cannot be implemented in a single diffusion area, because none of the four interconnect lines W7, N7, S7, E7 has a programmable connection to any interconnect line in a different lane. For example, interconnect line W7 has connections to N7, S7, and E7, (through PIPs 11, 12, and 13, respectively) but not to any other interconnect lines such as N6 or N0. Therefore, this structure has no lane-changing capability.

Figure 2:
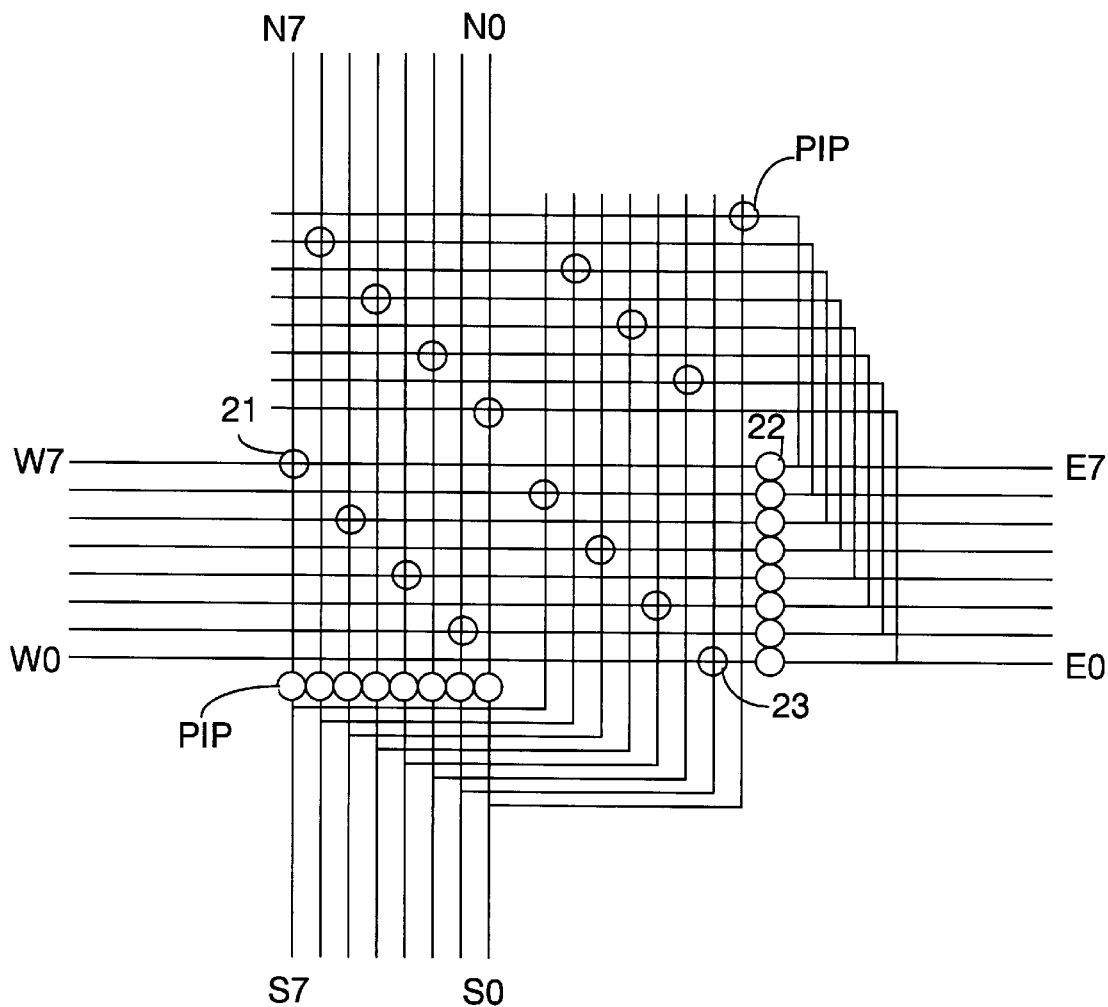
FIG. 2 is an architectural representation of a second programmable routing structure.

FIG. 2 shows a programmable routing structure that can be implemented in a single, minimal diffusion area. This structure is disclosed in U.S. application Ser. No. 08/761,113 entitled "FPGA One Turn Routing Structure and Method Using Minimum Diffusion Area", referenced above and incorporated herein by reference. However, this structure is a one-turn structure. Each interconnect line can go straight and make either a left or right turn, but not both. For example, interconnect line W7 has connections to N7 and E7 (through PIPs 21 and 22, respectively), but not to S7. Notwithstanding the fact that some of the interconnect lines have lane-changing capability (e.g., W0 connects to S1 through PIP 23), the one-turn restriction makes this structure less flexible than a structure according to the invention having the same number of interconnect lines.

Figure 3:
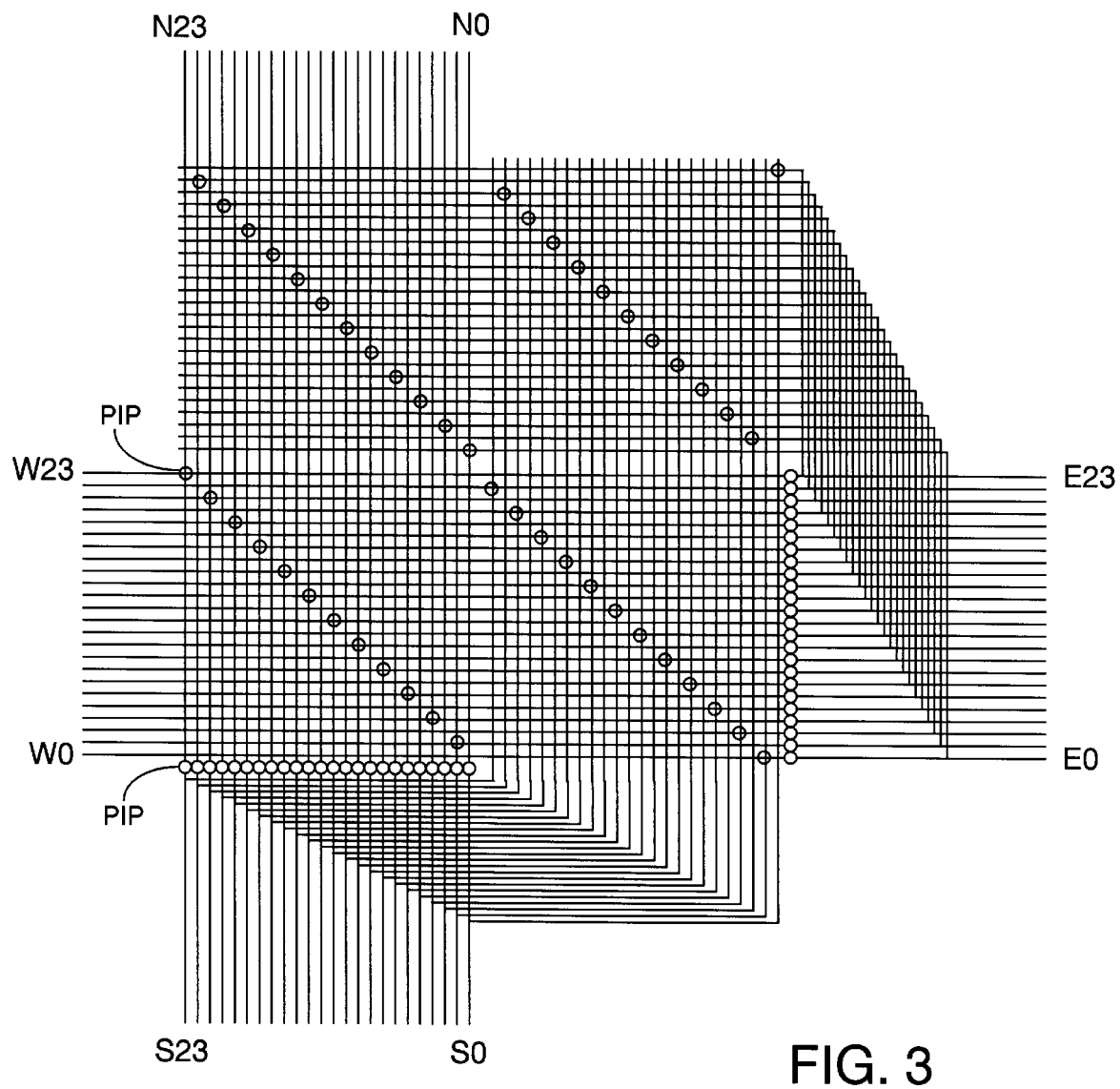
FIG. 3 is an architectural representation of the second programmable routing structure illustrated in FIG. 2, but showing a larger number of interconnect lines and signal paths.

FIG. 3 shows an extension of the routing structure in FIG. 2 to a structure with a larger number of interconnect lines. FIG. 3 is included as a useful point of comparison for FIG. 6A, as later discussed.

In FIGS. 4A–6B, interconnect lines in accordance with the present invention assume four different directions, which for the sake of clarity and convenience are deemed to be parallel to the four compass directions South (S), North (N), East (E) and West (W).

Figure 4A:
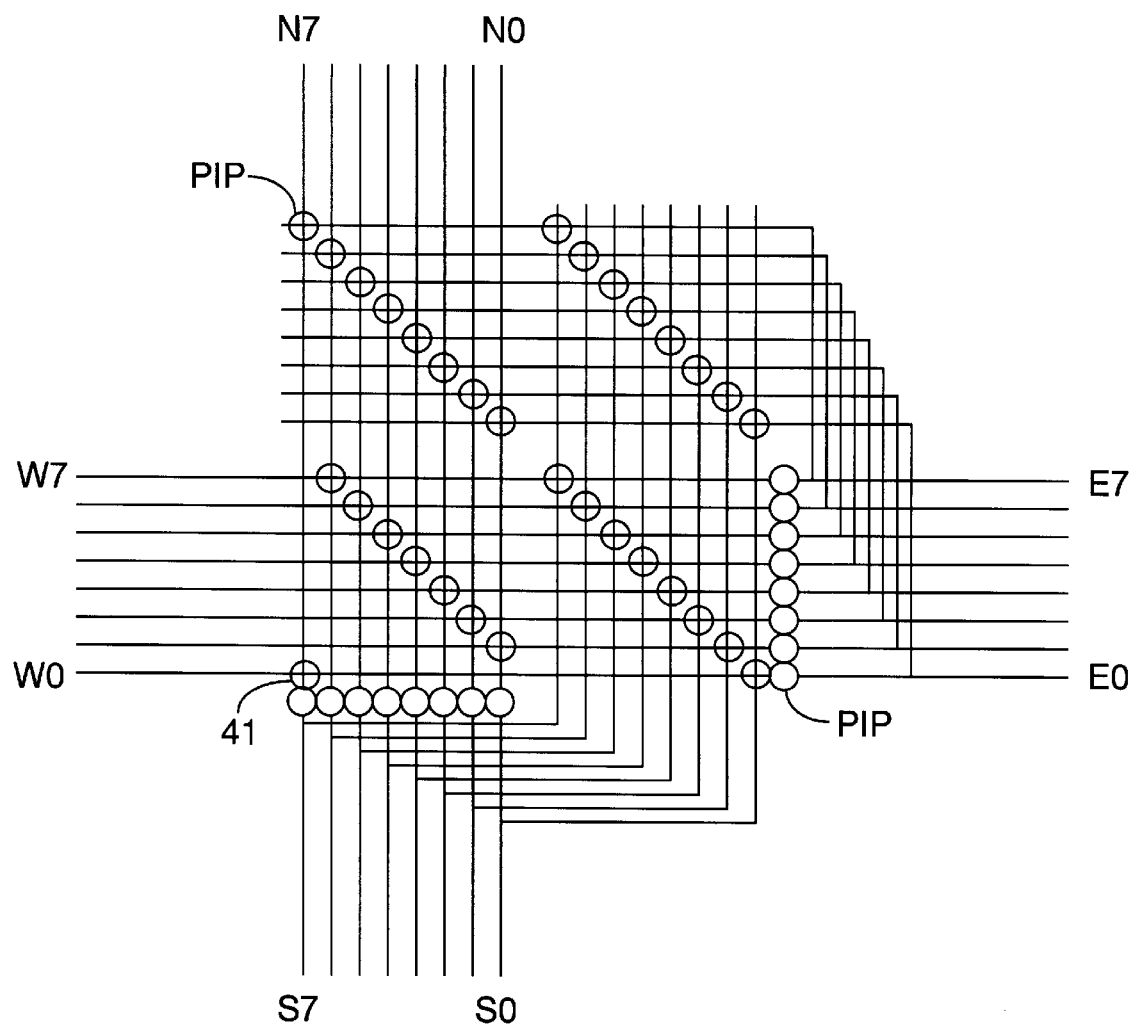
FIG. 4A is an architectural representation of a programmable routing structure according to the first embodiment of the invention, with the same number of interconnect lines as FIGS. 1 and 2.

FIG. 4A is a simple architectural representation of the first embodiment of the invention. FIG. 4A shows that, architecturally, the invention results in a structure similar to the two-turn prior art structure of FIG. 1. The same number of PIPs are provided. However, there is a crucial difference which enables the several advantages of the invention. The PIPs between the North and West interconnect lines are "shifted" by one position (for example, W0 connects to N7 through PIP 41). A "shift", a connection between two directions in two different sets, enables both the diffusion sharing and lane-changing advantages of the invention.

Figure 4B:
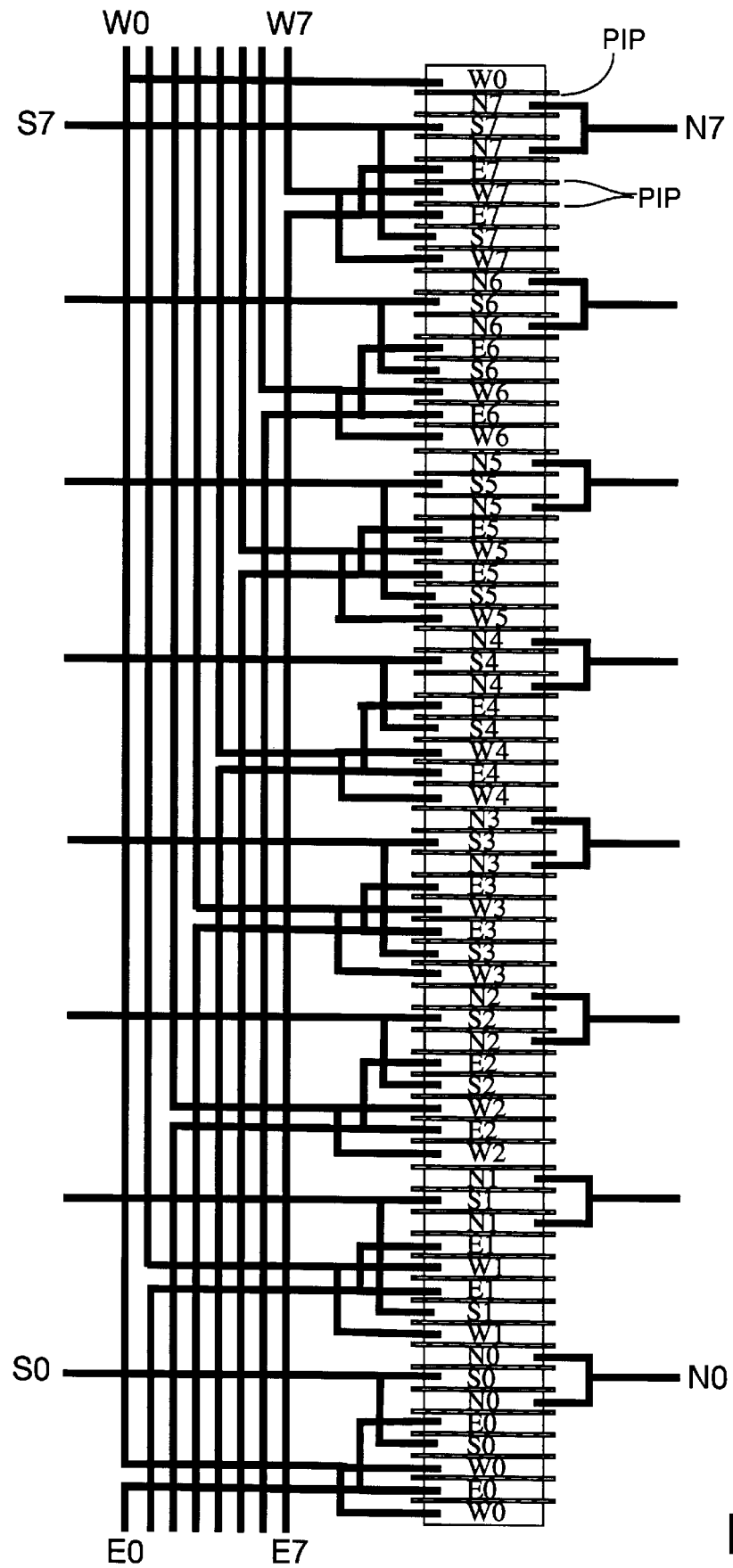
FIG. 4B illustrates the arrangement of the diffusion area and transistor gates for the first embodiment of the invention.

In FIG. 4B, 32 interconnect lines are routed in accordance with the inventive method of the first embodiment shown in FIG. 4A. In FIG. 4B, each interconnect line is shown as intersecting the diffusion area perpendicular to the elongated direction of the diffusion area, and is electrically connected thereto. Each diffusion region (intersection region) has two adjacent diffusion regions, except for the diffusion regions at either end of the diffusion area, which have only one adjacent diffusion region. Adjacent diffusion regions are separated by programmable n-channel transistor gates, which permit selective interconnection between adjacent diffusion regions by user programming. Therefore, these transistors implement the PIPs and control the programmed signal path. Some PIPs are implemented as two transistors connected in parallel. (The programmable control logic for the PIPs is not shown in FIG. 4B.) Sets of adjacent diffusion regions are established. For the preferred embodiments, a set consists of eight diffusion regions, with two perpendicular triples and two perpendicular singles. The first embodiment includes eight such sets.

Each set conforms to the inventive criteria: the set includes an even number of triples (2) and an equal even number of singles (2); half the triples in the set are perpendicular to the other half; half the singles in the set are perpendicular to the other half; the set includes an equal number of diffusion regions (2) having associated directions that correspond to each of the four compass directions; each triple is adjacent only to diffusion regions having associated directions perpendicular to the direction of said triple, and, where there are two such adjacent diffusion regions, said two diffusion regions have associated directions opposite to each other; and each single is electrically connected to the center of a triple, which in this embodiment is in the same set.

In the first embodiment, two different sequences of associated directions are used; alternating sets use the two different sequences. The first such sequence for this embodiment is W, E, W, S, E, N, S, N. The second sequence is W, S, E, W, E, N, S, N. The sets having these two sequences of associated directions, when adjoined, form a pattern of 16 diffusion regions, which is repeated four times along the diffusion area. For this embodiment, the repeating pattern has the associated sequence W, E, W, S, E, N, S, N, W, S, E, W, E, N, S, N. An extra diffusion region, not part of any pattern, is added at one end of the diffusion area. This extra diffusion region has the same associated direction and is connected to the same interconnect line as the diffusion region at the opposite end of the diffusion area.

In the first embodiment, each set includes four "pairs" of diffusion regions having the same associated direction, including one pair associated with each of the four compass directions. The two diffusion regions in each pair within each set are electrically connected to each other. Therefore, in this embodiment, the two outside diffusion regions in each triple are electrically connected. The diffusion regions at the two ends of the diffusion area are electrically connected via interconnect line W0, such that the repeated pattern can continue uninterrupted in a repeating fashion.

FIG. 4C shows the sequence of FIG. 4B in tabular form, in order to clarify the pattern of associated directions assigned to sequential diffusion regions. The first column shows the interconnect line attached to each diffusion region. Each interconnect line is designated by a letter identifying its associated direction, followed by a number identifying the lane. The second column identifies the triples of sequential diffusion areas. The third column identifies the sets of eight diffusion regions within each repeating pattern, assigning to each such set a variable "i" to differentiate the set. When no shifting is present, as in this embodiment, the set variable "i" is also the lane number of each diffusion region in the set. The fourth column clarifies the extent of each repeating pattern. The repeating pattern for the first embodiment is a sequence of two sets, or 16 diffusion regions.

FIGS. 4B and 4C clarify one of the advantages of the invention. The straight paths through a routing structure can easily be used to route heavily loaded signals, or signals traveling long distances across an FPGA. In the embodiment of FIGS. 4B and 4C, these straight paths are always routed through the PIPs forming the triples. As seen in FIGS. 4B and 4C, the routing structure of the first embodiment implements each of these PIPs as a pair of transistors, i.e., there are two transistors connecting the two interconnect lines rather than the single transistor used for turning signals. Therefore, the straight path through the routing structure is also the fastest path through the structure.

Although the preferred embodiments show sets with only eight diffusion regions, sets with larger numbers of diffusion regions will become obvious to persons of ordinary skill in the art on reading this disclosure, and are encompassed by the present invention.

In the first embodiment of the invention, shown in FIGS. 4A, 4B and 4C, each pair of diffusion regions having the same associated direction within each set are electrically connected. Clearly, in this embodiment only the two interconnect lines connected to the two outermost diffusion regions in each set have a programmable path to interconnect lines in other lanes. A programmable path between two diffusion regions in two different sets provides the capability of lane-changing. Therefore, in the first embodiment two out of every four interconnect lines has lane-changing capability while traversing a single PIP.

Figure 5A:
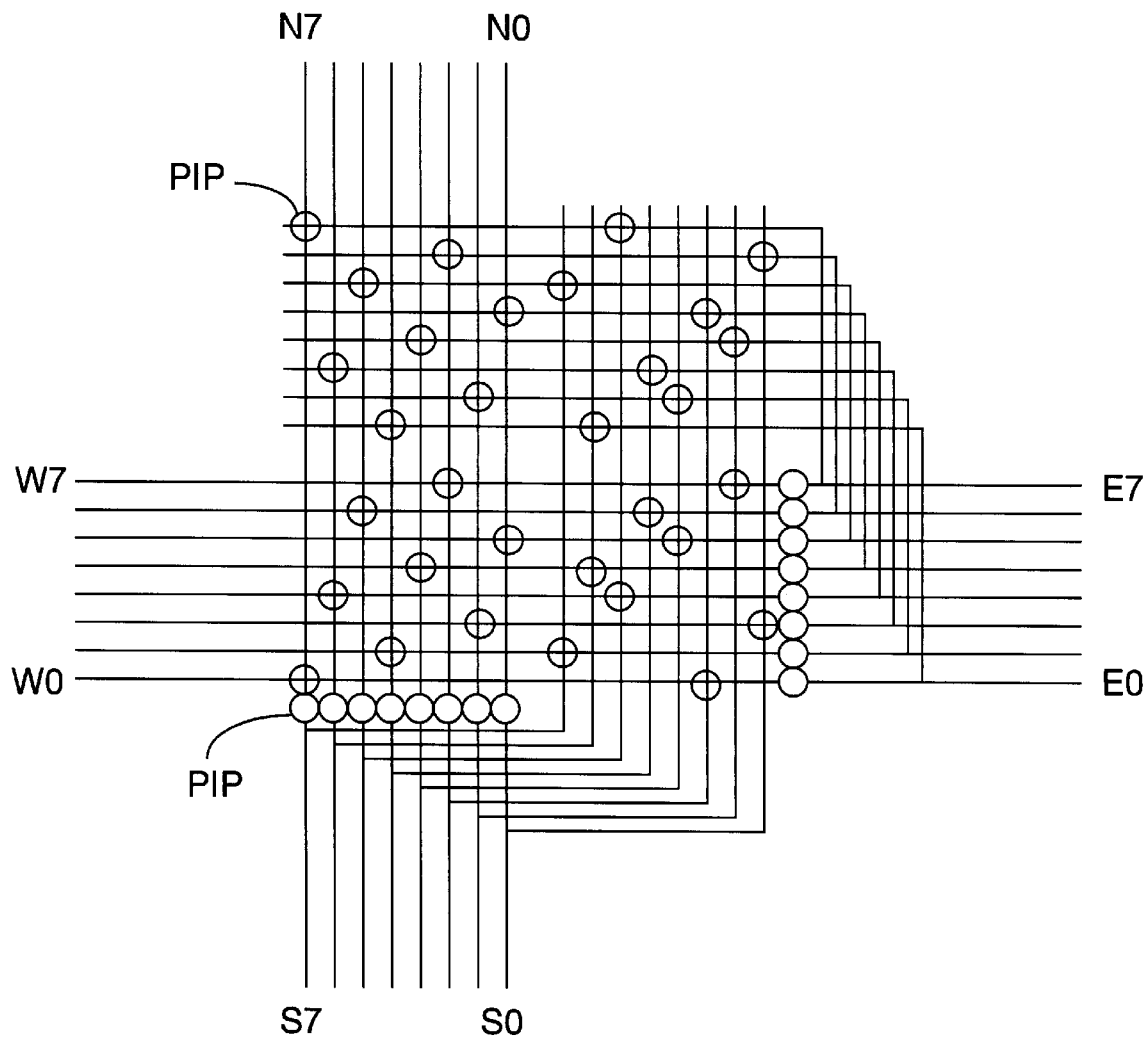
FIG. 5A is an architectural representation of a programmable routing structure according to the second embodiment of the invention, with the same number of interconnect lines as FIGS. 1, 2, and 4A.
Figure 5B:
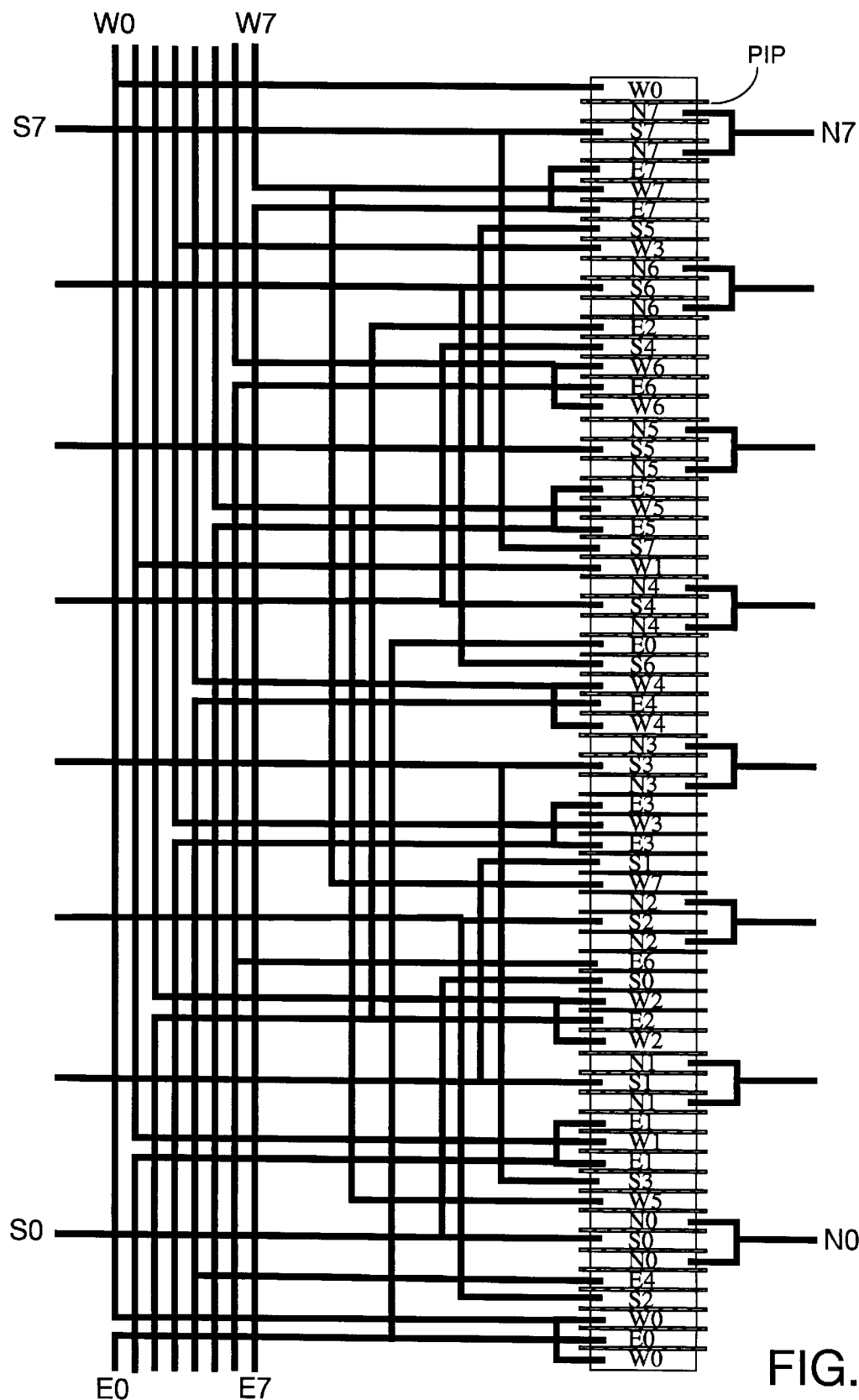
FIG. 5B illustrates the arrangement of the diffusion area and transistor gates for the second embodiment of the invention.

A second embodiment of the invention, shown in FIGS. 5A, 5B and 5C, includes the same sets and the same sequence of associated directions as the first embodiment. However, the pattern is twice as long (32 diffusion regions) because of the electrical connections between diffusion regions in different sets. The second embodiment uses the two singles in each set to increase the lane-changing capability of the routing structure. Each of the singles in a given set is electrically connected to the center of a triple in a different set. Since each interconnect line is connected to two diffusion regions, and at least one of the two diffusion regions appears somewhere in the diffusion area either as a single, next to a single, or next to a set boundary, every interconnect line in the resulting structure can change lanes. A path entering such a routing structure on any interconnect line has the ability to perform a lane change within the routing structure while traversing a single PIP.

FIG. 5A is a simple architectural representation of the second embodiment of the invention which is more fully shown in FIG. 5B. Comparing FIG. 5A with the first embodiment in FIG. 4A, it is seen that although the same number of PIPs are provided, the second embodiment permits much more lane-changing among the interconnect lines.

In FIG. 5B, 32 interconnect lines are routed in accordance with the second embodiment. The sequence of associated directions is the same in both first and second embodiments. However, in the second embodiment the singles have been shifted between sets as follows: East singles are shifted "up" by four sets; West singles are shifted "down" by four sets, and South singles are twice shifted up by two sets and twice down by two sets. These shifting patterns are continued across the ends of the diffusion area in a repeating pattern enabled by the electrical connection of the two diffusion regions at opposite ends of the diffusion area. Comparing FIG. 5B with the first embodiment in FIG. 4B, it is seen that even with the greatly increased lane-changing capability, the diffusion surface area required to implement the structure has not changed. However, more metal tracks are required to implement the connections between the singles in different sets.

FIG. 5C shows the sequence of FIG. 5B in tabular form, in order to clarify the pattern of associated directions assigned to sequential diffusion regions. The first column shows the interconnect line attached to each diffusion region. The second column identifies the triples of sequential diffusion regions, and also identifies the pattern of upward and downward shifting among the singles. The third column identifies the sets of eight diffusion regions within each repeating pattern, assigning to each such set a variable "i" to differentiate the set. The fourth column clarifies the extent of each repeating pattern. Because of the up and down shifting on the South interconnect lines, the repeating pattern for the second embodiment is a sequence of four sets, which in this case is 32 diffusion regions.

Figure 6A:
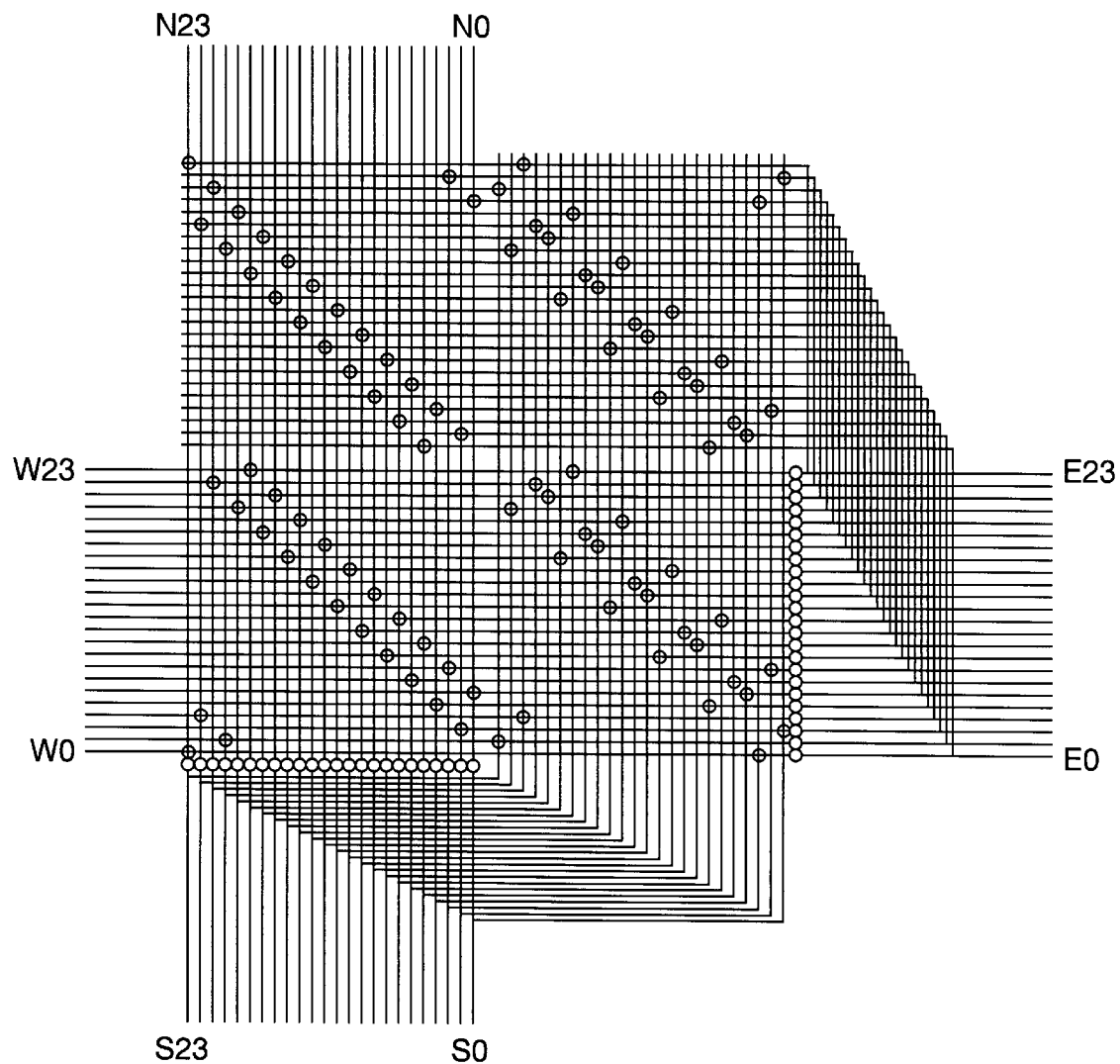
FIG. 6A is an architectural representation of a programmable routing structure similar to FIG. 5A and also according to the second embodiment of the invention, but showing a larger number of interconnect lines and signal paths.

FIG. 6A is a simple architectural representation of the second embodiment of the invention earlier shown in FIG. 5A, but extended to show 96 interconnect lines. Comparing FIG. 6A to FIG. 5A, the repetitive pattern of shifting is more clearly seen in the larger structure. Comparing FIG. 6A to FIG. 3, it is seen that twice as many PIPs are provided in FIG. 6A, due to the two-turn nature of FIG. 6A and the one-turn nature of FIG. 3. However, it is also clear that the simple pattern of limited shifting in FIG. 3 has been replaced by a much more complex pattern in the routing structure of FIG. 6A.

FIG. 6B shows the sequence of FIG. 6A in tabular form. The columns of the table and the pattern of associated directions are the same as in FIG. 5C, extended to accommodate the larger number of interconnect lines. Columns 2 and 4 of the table are shown for only one pattern, because they are the same for each repeated pattern.

Although the second embodiment uses a pattern wherein the singles in one direction are shifted "up" by four sets, the singles in the opposite direction are shifted "down" by four sets, and the singles in a perpendicular direction are twice shifted up by two sets and twice down by two sets, other patterns of shifting can be used and will be obvious to persons of ordinary skill in the art as a result of this disclosure, and are encompassed by the present invention.

Figure 7A:
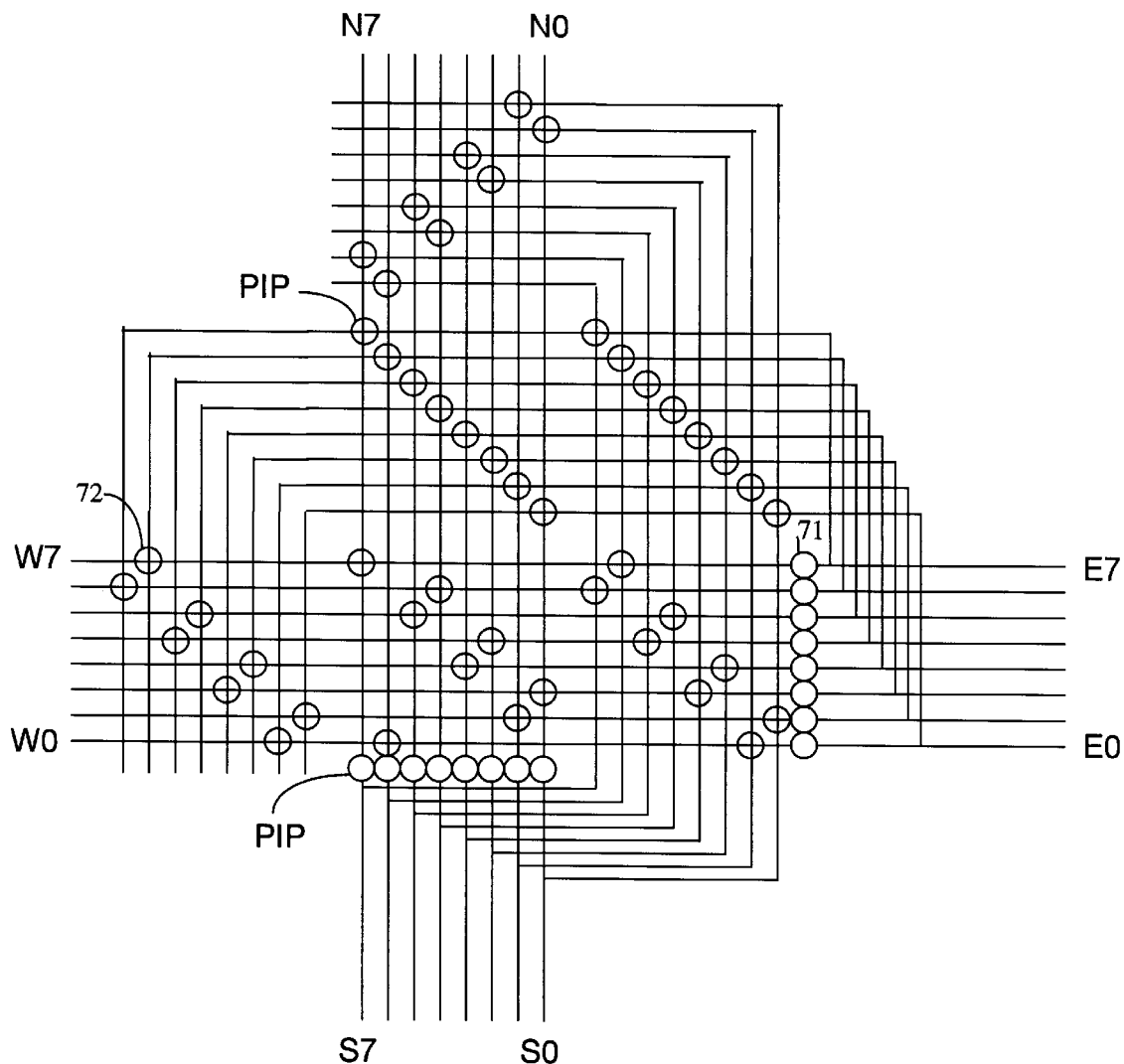
FIG. 7A is an architectural representation of a programmable routing structure according to the third embodiment of the invention, with the same number of interconnect lines as FIGS. 1, 2, 4A, and 5A.

FIG. 7A is a simple architectural representation of the third embodiment of the invention which is shown in tabular form in FIG. 7B. Comparing FIG. 7A to FIGS. 4A and 5A, it is clear that 16 more PIPs are provided in the third embodiment. These additional PIPs correspond to transistors that in FIGS. 4A and 5A were devoted to creating "double-sized" PIPs (PIPs with two transistors connected in parallel) for the straight paths. In the third embodiment, all PIPs are formed by a single transistor, so no fast paths are available. However, there are two straight paths available for each interconnect line entering the routing structure, instead of only one. For example, W7 can connect either to E7 (through PIP 71) or to E6 (through PIP 72). This ability to route extra straight interconnect lines increases the routability of the interconnect structure and can be especially useful, since straight lines can easily be used to route long or heavily loaded signals, as discussed above.

FIG. 7B is a table showing the pattern of associated directions assigned to sequential diffusion regions in the third embodiment of the invention, also shown in FIG. 7A. The repeating pattern for the third embodiment is a sequence of two sets, or 16 diffusion regions. However, the sequence of associated directions is the same within each set. The repeating pattern is formed by connecting one of the two outside diffusion regions in each triple to an outside diffusion region of another triple in an adjacent set. Since two adjacent sets "swap" connections in this embodiment, the repeating pattern consists of two such sets, as shown in FIG. 7B.

The preferred embodiments of the invention implement one or more sets along a single diffusion area, as this approach minimizes the total diffusion surface area required to implement the routing structure. However, the single diffusion area of the preferred embodiments can also be divided into multiple smaller diffusion areas wherein the sequence of directions according to the invention is continued from one diffusion area to another. (In this case, of course, the diffusion region at the division point must be duplicated in both diffusion areas.) Also, it is typical to include other diffusion areas and diffusion regions in an FPGA for other circuit structures, which may be added to a diffusion area of the invention. The addition of such structures falls within the scope of the invention.

One measure of routing efficiency is the minimum number of transistors in a single routing structure that a path must go through before returning to the same interconnect line (completing a "cycle"). The more transistors there are per cycle, the larger the number of possible paths starting at a given interconnect line and having a given number of transistors therein. The larger the number of interconnect lines that can be reached by traversing a given number of transistors, the more flexible the routing structure is considered to be.

As an example, using only the transistors in one routing structure, in the prior art routing architecture of FIG. 1 the number of reachable interconnect lines is fairly restricted. In FIG. 1, a path starting at W0 can reach three different interconnect lines by traversing one transistor, the same three lines by traversing two transistors, and the same three lines by traversing three transistors.

In FIG. 5A, using only the transistors in one routing structure, a path starting at W0 can reach three different interconnect lines by traversing one transistor. An additional six lines can be reached by traversing two transistors, and yet another twelve lines by traversing three transistors. Therefore, a much larger number of paths is available in the routing structure of FIG. 5A than in the prior art structure of FIG. 1. The higher the number of transistors allowed in the path, the larger the number of available paths compared to the prior art structure.

Thus, using this measure of routing flexibility, it is apparent that the routing structure according to the invention is more flexible than the prior art structure shown in FIG. 1.

It has been demonstrated that the programmable routing structure of the present invention offers the advantages of high flexibility (including a two-turn architecture); lane-changing capability for some or all interconnect lines in the structure; a small diffusion surface area requirement (which may be optimized by using a unitary diffusion area); and, in some embodiments, a fast path for each interconnect line running straight through the routing structure. The prior art structure with two turns shown in FIG. 1 has a high diffusion surface area requirement and no lane-changing capability; while routing structures offering a small diffusion surface area (shown in FIGS. 2 and 3) have only one-turn capability and fewer PIPs for the same number of interconnect lines. None of these routing structures offer a fast path straight through the structure. Thus it will be understood that the present invention provides a novel programmable routing structure in a programmable logic device or portion thereof.

Those having skill in the relevant arts of the invention will now perceive various modifications and additions which may be made as a result of the disclosure herein of preferred embodiments. Accordingly, all such modifications and additions are deemed to be within the scope of the invention, which is to be limited only by the appended claims and their equivalents.

What is claimed is:

1. A programmable routing structure in an integrated circuit device having programmable interconnections and at least one elongated diffusion area, wherein:

said diffusion area is separated into adjacent diffusion regions by transistor gates;

each of said diffusion regions has an associated direction taken from the group of four compass directions;

each such diffusion region is part of either a "triple", or a "single";

said triple comprising a group of three adjacent diffusion regions wherein the directions associated with the two outer diffusion regions are the same, and the direction associated with the central diffusion region is parallel but opposite thereto;

said single comprising one of said diffusion regions which is not part of a triple; and wherein said diffusion regions can be formed into one or more sets of adjacent diffusion regions wherein each such set conforms to the following criteria:

said set includes an even number of said triples and an equal number of said singles;

half of said triples in said set are perpendicular to the other half of said triples in said set;

half of said singles in said set are perpendicular to the other half of said singles in said set;

said set includes an equal number of diffusion regions having associated directions corresponding to each of said four compass directions;

each of said triples is adjacent only to diffusion regions having associated directions perpendicular to the direction of said triple, and, where there are two such adjacent diffusion regions, said two diffusion regions have associated directions opposite to each other; and each of said singles is electrically connected to said central diffusion region of one of said triples, wherein said connected central diffusion region may be in said set and may be in a different such set.

2. The programmable routing structure recited in claim 1 wherein said two outer diffusion regions in each of said triples are electrically connected to each other.

3. The programmable routing structure recited in claim 1 or claim 2 wherein each of said singles in said set is electrically connected to said central diffusion region of one of said triples in said set.

4. The programmable routing structure recited in claim 1 or claim 2 wherein:

some of said singles in said set are electrically connected to said central diffusion regions in said set; and some of said singles in said set are electrically connected to said central diffusion regions in a different such set.

5. The programmable routing structure recited in claim 1 or claim 2 wherein:

said set is repeated along the elongated direction of said diffusion area, said repetition forming a pattern comprising a larger set; and said pattern conforms to said criteria.

6. The programmable routing structure recited in claim 1 or claim 2 wherein:

two of more of such sets are adjacent to each other, said adjacent sets forming a pattern comprising a larger set;

said pattern is repeated along the elongated direction of said diffusion area; and said pattern conforms to said criteria.

7. The programmable routing structure recited in claim 1 or claim 2 wherein:

one or more of such sets are adjacent to each other, said adjacent sets forming a pattern having a first diffusion region at one end of said pattern and a last diffusion region at the opposite end of said pattern;

said pattern conforms to said criteria;

an extra diffusion region not part of said pattern exists adjacent to said last diffusion region; and said extra diffusion region is electrically connected to said first diffusion region.

8. The programmable routing structure recited in claim 7 wherein said first diffusion region has an associated direction parallel to the elongated direction of said diffusion area.

9. The programmable routing structure recited in claim 1 wherein one of said two outer diffusion regions in at least one said triple is electrically connected to one of said two outer diffusion regions in a different such triple.

10. An integrated circuit device having a plurality of programmable interconnections among a plurality of interconnect lines forming a plurality of routing structures, each interconnect line having an associated direction defined by the predominant direction said interconnect line extends from one of said routing structures, comprising:

a diffusion area elongated along a given direction having a plurality of serially arrayed diffusion regions, two of said diffusion regions being connected to each respective interconnect line of said plurality of interconnect lines, each such diffusion region having a direction associated therewith based on the associated direction of its respective interconnect line, each diffusion region further being selectively connectable to at least one adjacent diffusion region by a voltage-controlled transistor gate for transmitting a signal on one said interconnect line having a first associated direction to another said interconnect line having a second associated direction;

said diffusion regions and said associated directions conforming to a serial pattern wherein at least one set of eight diffusion regions is formed, each such set including four pairs of diffusion regions, including one pair associated with each of the four compass directions, each such set comprising:

a first group of three adjacent diffusion regions having parallel associated directions;

a second group of three other adjacent diffusion regions having parallel associated directions perpendicular to the directions associated with said first group; and seventh and eighth diffusion regions having directions perpendicular to each other.

11. The integrated circuit device recited in claim 10 wherein:

said first and second groups each comprise two outer diffusion regions and a central diffusion region; and said two outer diffusion regions within each such group are electrically connected to each other.

12. The integrated circuit device recited in claim 10 or claim 11 wherein in at least one such set each such pair are electrically connected to each other.

13. The integrated circuit device recited in claim 10 or claim 11 wherein in at least one such set some of said pairs are electrically connected to each other and some other of said pairs are not electrically connected to each other.

14. The integrated circuit device recited in claim 10 or claim 11 wherein each of said seventh and eighth diffusion regions is electrically connected to a diffusion region in a different such set.

15. The integrated circuit device recited in claim 10 or claim 11 wherein one of such plurality of routing structures comprises two or more such sets, said sets being grouped into a repeating pattern.

16. The integrated circuit device recited in claim 15 wherein said pattern is formed by electrically connecting some of said diffusion regions with diffusion regions in other such sets.

17. The integrated circuit device recited in claim 10 or claim 11 wherein:

one or more such sets are adjacent to each other, said adjacent sets forming a pattern having a first diffusion region at one end of said pattern and a last diffusion region at the opposite end of said pattern;

an extra diffusion region not part of said pattern exists adjacent to said last diffusion region; and said extra diffusion region is electrically connected to said first diffusion region.

18. The programmable routing structure recited in claim 17 wherein said first diffusion region has an associated direction parallel to said elongated direction of said diffusion area.

19. The programmable routing structure recited in claim 10 wherein:

said first and second groups each comprise two outer diffusion regions and a central diffusion region; and one of said two outer diffusion regions in each such group is connected to another such outer diffusion region in a different such set.

* * * * *